(12) United States Patent
Sharan et al.

(10) Patent No.: US 6,291,341 B1
(45) Date of Patent: *Sep. 18, 2001

(54) METHOD FOR PECVD DEPOSITION OF SELECTED MATERIAL FILMS

(75) Inventors: Sujit Sharan; Gurtej S. Sandhu, both of Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 09/249,478

(22) Filed: Feb. 12, 1999

(51) Int. Cl.$^7$ ................................. H01L 21/4763
(52) U.S. Cl. ............... 438/648; 438/584; 438/630; 438/656; 438/680; 438/681; 438/683; 427/248.1; 427/250; 427/252; 427/253; 427/255.1
(58) Field of Search ..................... 438/584, 630, 438/648, 656, 680, 681, 683; 427/248.1, 250, 252, 253, 255.1

(56) References Cited

U.S. PATENT DOCUMENTS 5,946,594 * 8/1999 Sharon .......................... 438/648
6,184,136   2/2001 Iyer et al. ......................... 438/685

OTHER PUBLICATIONS

Nasser, Essam. Fundamentals of Gaseous Ionization and Plasma Electronics. 214–217 (1971).

Llewellyn–Jones, F. The Glow Discharge and an Introduction to Plasma Physics. 21–24, 152–154 (1966).

* cited by examiner

*Primary Examiner*—Charles Bowers
*Assistant Examiner*—Lisa A Kilday
(74) *Attorney, Agent, or Firm*—Charles Brantley

(57) ABSTRACT

A process for PECVD of selected material films on a substrate comprising the steps of placing a substrate in a PECVD chamber and maintaining the chamber under vacuum pressure while introducing a precursor gas, a reactant gas, and an ionization enhancer agent into the chamber. A plasma is generated from the gases within the chamber. The energy generating the plasma causes the formation of charged species. The resulting charged species of the ionization enhancer agent assists in the formation of chemically reactive species of at least the precursor.

18 Claims, 3 Drawing Sheets

METHOD FOR PECVD DEPOSITION OF SELECTED MATERIAL FILMS

TECHNICAL FIELD

This invention relates to integrated circuit manufacturing processes and, more specifically, to a novel process for plasma enhanced chemical vapor deposition of metal films.

BACKGROUND OF THE INVENTION

In order to build an integrated circuit, many active devices need to be fabricated on a single substrate. The current practice in semiconductor manufacturing is to use thin film fabrication techniques. A large variety of materials can be deposited using thin films, including metals, semiconductors, insulators, and the like. The composition and uniformity of these thin layers must be strictly controlled to facilitate etching of submicron features. The surface of the substrate, most often a wafer, must be planarized in some way to prevent the surface topography from becoming increasingly rough with each added thin film level. Every layer deposited on the top surface of the wafer that possesses irregularities and variations in its uniformity has an adverse affect during all subsequent processing steps that the wafer undergoes. Uniformity of the layers is a critical factor in semiconductor wafer production. The formation of such films is accomplished by a large variety of techniques.

Chemical vapor deposition (CVD) processes are often selected over competing deposition techniques because they offer numerous advantages, including the abilities of CVD to deposit films from a wide variety of chemical compositions and provide improved conformability.

In general, a CVD process includes the following steps: a selected composition and flow rate of gases are dispatched into a reaction chamber; the gases move to the substrate surface; the constituents making up those gasses are adsorbed on the substrate surface; the constituents undergo migration and film-forming chemical reactions; and the by-products of the reactions are desorbed from the surface and conveyed away from the surface.

Plasma enhanced CVD (PECVD) uses a plasma or glow discharge with a gas to create reactive species of the gasses introduced into the reaction chamber. This allows the substrate to remain at a lower temperature than in other CVD processes. A lower substrate temperature is the major advantage of PECVD and provides film deposition methods for substrates that do not have the thermal stability necessary for other processes that require higher temperature conditions. In addition, PECVD can enhance the deposition rate, when compared to thermal reactions alone, and produce films of unique compositions and properties.

As thin films cover changes in elevation that occur on the surface of the underlying substrate, they often suffer unwanted deviations from the ideal conformality, such as thinning or cracking. A measure of how well a film maintains its nominal thickness is referred to as the step coverage of the film. The height of the step and the aspect-ratio (the height-to-spacing ratio of two adjacent steps) of a feature being covered determine the expected step coverage.

The semiconductor industry's continuing drive towards closer and smaller device geometries has placed an increased demand for cost-effective solutions for the problem of higher step coverage and planarization. New plasma sources are being developed to extend to the sub-0.5 micron level of processing necessary for the more rigorous device geometries. CVD processes have been developed for some metals, for example titanium and titanium nitride, both of which can be put to use in 0.35 and 0.25 micron devices, as well as smaller devices. This is especially useful in processes taking place toward the end of the fabrication procedure, also known as back-end-of-the-line (BEOL) processes. At this point, layers have already been deposited and doped, yet the semiconductor device must still undergo further fabrication. For example, interconnects may still have to be formed. As a result, the BEOL fabrication processes must be done at low temperatures (<450° C.) to protect the integrity of these previously deposited layers and to ensure that dopants do not diffuse excessively. Thus, BEOL processes are typically based on PECVD, which, as described above, can be achieved at low temperatures.

These low temperature, high aspect ratio coverage PECVD process requirements are being met with low pressure, high density plasma (HDP) based processes. To achieve the good step coverage and gap fill desired, HDP CVD systems are run at a high flow rate to achieve adequate deposition. At the same time HDP CVD process pressures need to be relatively low for the plasma to operate at high densities.

To deposit conductive or metal films using high density PECVD, it is preferred that the plasma be generated using inductive coupling. The deposition of metal thin films in an inductively coupled high density plasma reactor is desirable because of the advantages it provides, including: lower processing temperatures and higher step coverage, as discussed above, as well as shorter deposition times and denser films.

Plasma deposition or etching processes using chemical reactions which are not very favorable thermodynamically result in very low deposition or etching rates. In many cases simply increasing the process pressure is not feasible as described above for the low pressure and high density PECVD processes. Increasing the pressure would most likely lead to degradation in step coverage or inclusion of impurities into the film. In such cases, it is desirable to increase the ionization efficiency of the reactants in the plasma.

One method to improve coverage is to increase the acceleration of the ions from the discharge toward their surfaces. The impinging ions transfer energy to surface atoms, and cause them to be transported to the sidewalls of structures on or formed from the substrate, where they accumulate and locally increase film thickness. There is a constant need in the art, however, for alternative methods of improving providing good deposition in general and in PECVD processes in particular.

SUMMARY OF THE INVENTION

Accordingly, the present invention concerns promoting a reaction in a plasma process through the addition of a material to that process. In one embodiment, adding such a material reduces the partial pressure contribution of at least one other gas reacting in said process. In one exemplary embodiment, the material added is a generally inert gas, such as a noble gas, that nevertheless encourages a reaction among other gases. In another exemplary embodiment, the material is inert with respect to the current reaction, although it may be chemically active in other reactions. In yet another exemplary embodiment the material chemically reacts with the other gases.

Additional embodiments involve using at least one of these types of materials in plasma processes such as deposition, etching, and sputtering.

A specific embodiment involving deposition concerns a process for PECVD of a film on a substrate. This exemplary embodiment comprises the steps of placing a substrate in a PECVD chamber; maintaining the chamber under vacuum pressure; introducing a metal precursor deposition gas and a chemically inert reactive species producer gas into the chamber; generating a plasma from the gases within the chamber, thereby causing the formation of charged species. The chemically inert reactive species producer gas increases the ionization efficiency of the gases and thereby increases the reaction rate of the process as measured by the deposited film's thickness, uniformity and conformality. This non-obvious result is in spite of the fact that the partial pressure of the reactant species in the plasma is actually reduced due to the inclusion of the chemically inert reactive species producer gas. The increased reaction rate and overall improved end product quality is especially useful for deposition or etching processes using chemical reactions which otherwise are generally not very favorable thermodynamically and normally result in very low deposition or etching rates. In many cases simply increasing the process pressure is not a possibility because the need for the reactants to form films inside high aspect ratio contact holes cannot be accomplished except at low pressures.

Many of the embodiments of the current invention provide an improved method for film deposition for the smaller geometries that are now crucial to device functionality. Further, the faster reaction and film deposition rates of certain embodiments favor higher production throughputs, reduced chemical disposal costs, and other economic benefits that are prerequisite to the economic fabrication of integrated circuits. In accordance with those embodiments, products can be manufactured more economically by inclusion of the reaction promoting material. An example of such a product is integrated circuits.

DETAILED DESCRIPTION OF THE PREFERRED EMBODIMENTS

Figure 1:
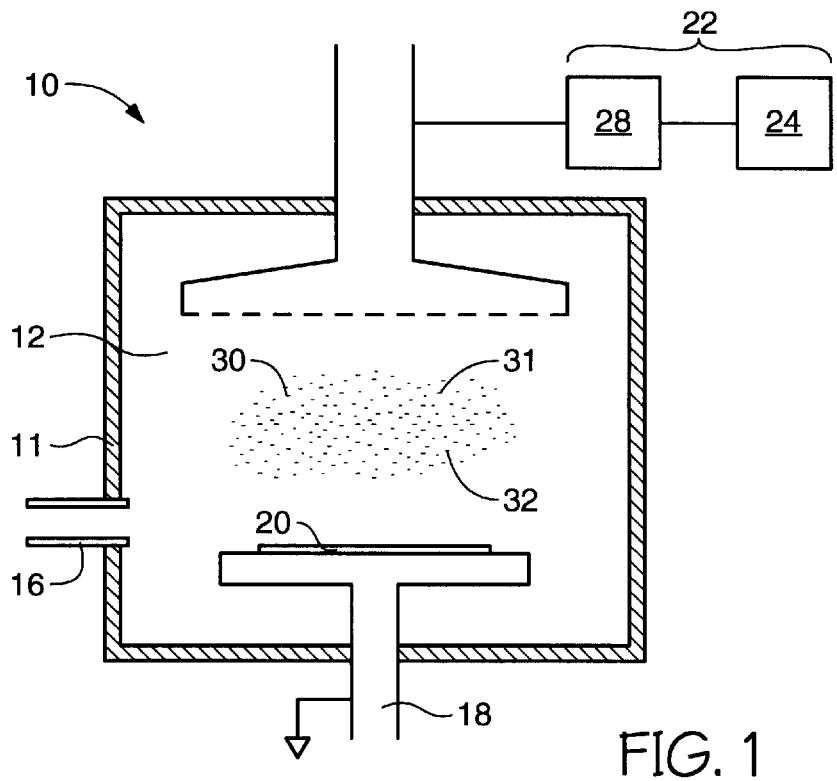
FIG. 1 is a schematic drawing of an exemplary PECVD chamber suitable for use with at least one embodiment of the current invention.

Embodiments of the inventive process can be performed in any PECVD system. One such system is an inductively coupled high density plasma PECVD system, which is well suited for deposition of metal-containing thin films. This high density plasma PECVD system is generally designated as element 10 in FIG. 1, although it should be understood that the apparatus and embodiments described herein are meant to be non-limiting examples to illustrate the process claimed in this invention.

In system 10, a radio-frequency inductively coupled type of PECVD apparatus is provided with a housing 11 defining a reaction chamber 12 that has a showerhead 50 in flow communication with at least one gas source, which is not shown. Housing 11 is formed from any appropriate material, here from an insulating material that is transparent to radio-frequency waves, for example quartz. In this embodiment, a precursor gas (containing at least a portion of the material that will remain on the substrate surface), a reactant gas (containing a constituent reactable with a constituent of said precursor gas), and an inert reaction-promoter are introduced to the reaction chamber 12, through the showerhead 50. The system 10 also includes a gas exhaust device 16 in fluid communication with a source of vacuum for exhausting gas from chamber 12 and for maintaining a predetermined degree of vacuum therein. System 10 further includes a plasma generator 22 which, in this system 10, is coupled to the showerhead 50. Also in this system 10 is a holder device 18 that is configured to hold a substrate 20, typically a semiconductor-containing wafer. In the current application, the term "substrate" or "semiconductor substrate" will be understood to mean any construction comprising semiconductor material, including but not limited to bulk semiconductive materials such as a semiconductor wafer (either alone or in assemblies comprising other materials thereon), and semiconductive material layers (either alone or in assemblies comprising other materials). Further, the term "substrate" also refers to any supporting structure including, but not limited to, the semiconductive substrates described above. The term substrate may also refer to one or more semiconductor layers or structures which includes active or operable portions of semiconductor devices.

Figure 2:
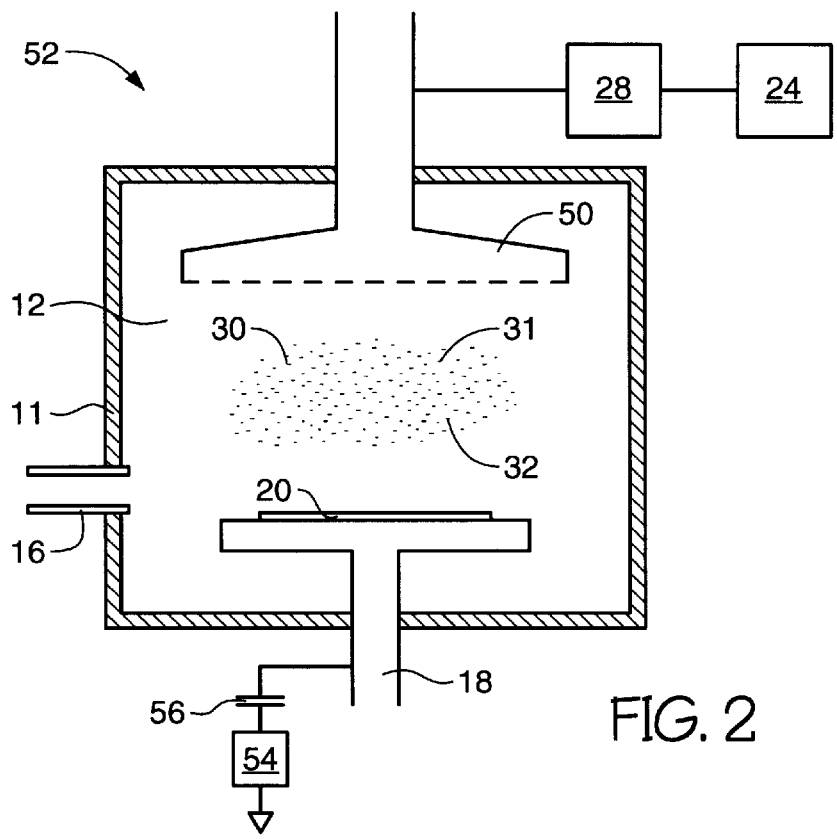
FIG. 2 is a schematic drawing of another exemplary PECVD chamber suitable for use with at least one embodiment of the current invention.
Figure 3:
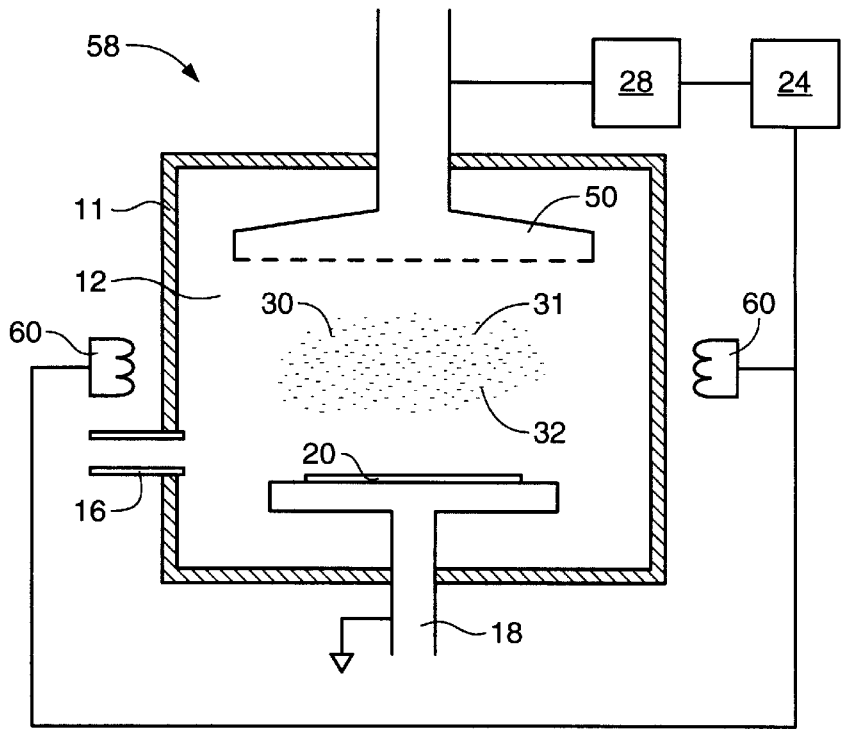
FIG. 3 is a schematic drawing of yet another PECVD chamber suitable for use with at least one embodiment of the current invention.

Plasma generator 22 in this example includes a radio-frequency power source 24 connected to showerhead 50 by matching circuit 28. Radio-frequency waves are generated inside reaction chamber 12, and metal precursor deposition gas 30 is ionized by this electromagnetic energy to cause the generation of a plasma. Holder device 18, here a susceptor, is shown in FIG. 1 as being grounded. An alternate system 52 is shown in FIG. 2, wherein another radio-frequency power source 54 is connected to the holder device 18 through an interposing blocking capacitor 56. Radio-frequency electric power is supplied from this radio-frequency power source 54, and a self-bias potential is maintained with respect to the plasma's potential, via the blocking capacitor. FIG. 3 depicts yet another system 58 wherein electrodes 60, 62 flank the reaction chamber 12. Methods of generating plasma are well known in the art and may involve the use of microwave sources and other conductive and inductive power sources.

Figure 4:
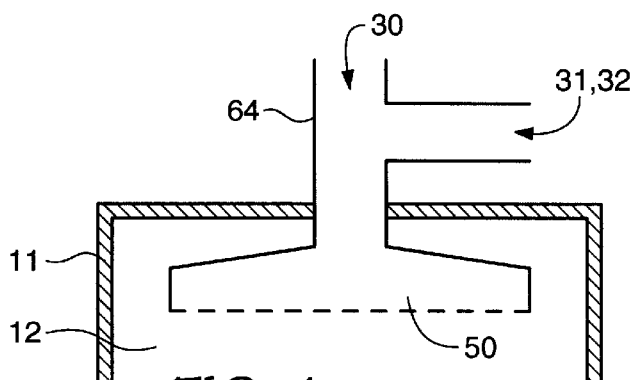
FIG. 4 is a schematic drawing of a portion of an exemplary PECVD chamber suitable for use with at least one embodiment of the current invention. Specifically, FIG. 4 details a gas delivery system for a CVD showerhead.
Figure 5:
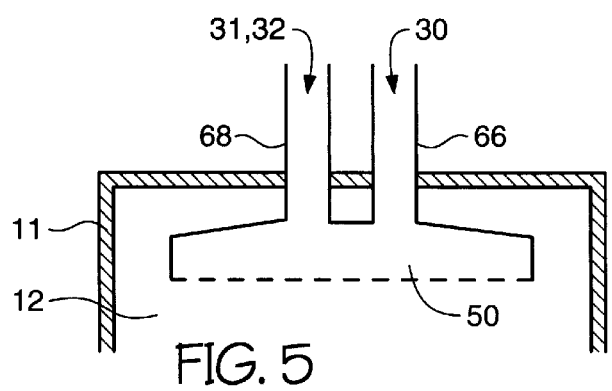
FIG. 5 is a schematic drawing of a portion of an exemplary PECVD chamber suitable for use with at least one embodiment of the current invention. Specifically, FIG. 4 details another gas delivery system for a CVD showerhead.
Figure 6:
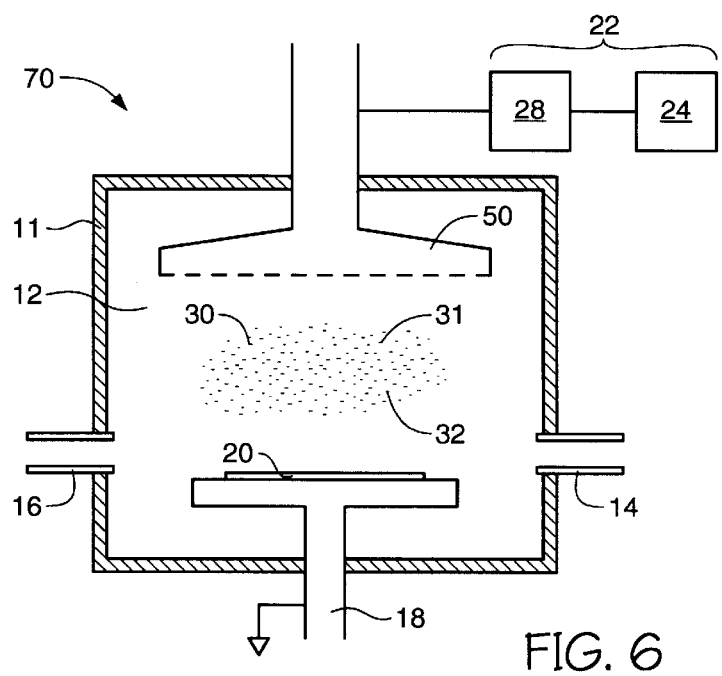
FIG. 6 is a schematic drawing of an exemplary PECVD chamber suitable for use with at least one embodiment of the current invention.

Returning to FIG. 1, a source of metal precursor deposition gas 30 as well as a source of a reactant gas 31 can be appropriately coupled to showerhead 50, through which deposition gas 30 is introduced into chamber 12. A supply of reaction-promoter gas 32 can be added to metal precursor deposition gas 30 by inclusion of any suitable gas premix system that is likewise coupled to enter chamber 12 through the showerhead 50. In FIG. 4, for example, a suitable gas premix system can be as simple as a "T"-shaped intersection in the supply conduit 64. In the FIG. 4, embodiment, deposition gas 30 flows to the showerhead 50 from one point while the reactant gas 31 and reaction-promoter gas 32, having already been mixed, flow from a different point. The gasses mix before reaching the showerhead 50. FIG. 5 shows an alternative configuration, wherein the deposition gas 30 reaches the showerhead through a conduit 66 completely separated from another conduit 68 carrying the reactant gas 31 and reaction-promoter gas 32 to the showerhead 50. With these arrangements, the chemically inert reaction-promoter gas 32 and metal precursor deposition gas 30 can be combined prior to introduction into reaction chamber 12. However, a suitable gas premix system could comprise any location where metal precursor deposition gas 30 and chemically inert reaction-promoter 32 exist conjointly in a manner that allows them to react appropriately with each other in reaction chamber 12. As shown in FIG. 6, for example, a PECVD system 70 can include a gas inlet 14 through which one or more of the gasses may enter the reaction chamber 12.

For the purposes of describing one particular embodiment of the invention, it is assumed that a deposition process is to be carried out within the PECVD system 10 described in FIG. 1. More specifically, it is assumed that titanium is being deposited from the reaction of titanium tetrachloride ($TiCl_4$) and hydrogen. Process parameters include a temperature of about 150 to about 500 degrees Celsius; a pressure ranging from about 1 millitorr to about 10 torr; an RF power ranging from about 50 watts to about 600 watts, preferably 500 watts, and at a frequency on the order of 13.56 MHz. The flow rate of the precursor gas $TiCl_4$ generally ranges between about 10 and about 50 sccm, but is preferably about 30 sccm, and the flow rate of the reactant gas $H_2$ is about 10,000 sccm. In addition, an inert reaction-promoter gas is flowed into the system 10. It is preferred that the flow rate percentage of reaction-promoter gas to reactant gas be at least 40%. In the current example, the reaction-promoter gas is flowed at a rate of about 5,000 sccm. Nevertheless, a flow rate of at least 4,000 sccm would be acceptable.

Without limiting the current invention, it is theorized that RF energy creates charged species of the constituents making up the precursor gas, the reactant gas, and the reaction-promoter gas. The charged species of the reaction-promoter gas, in turn, non-chemically interacts with the constituents of the precursor gas, thereby forming (1) a greater number of precursor charged species; (2) a greater charge of the precursor charged species; or (3) both. This may be due in part to a phenomenon known as the "Penning effect." (See F. LLEWELLYN-JONES, THE GLOW DISCHARGE AND AN INTRODUCTION TO PLASMA PHYSICS 21–24, 152–154 (1966); ESSAM NASSER, FUNDAMENTALS OF GASEOUS IONIZATION AND PLASMA ELECTRONICS 214–217 (1971).)

Applying this theory to the current exemplary embodiment, it is believed that the RF power forms charged species from the $TiCl_4$, the $H_2$, and the reaction-promoter gas. For purposes of explanation, the reaction-promoter gas is assumed to be argon. Thus, the RF power forms charged species of $TiCl_4$, such as $TiCl_3^+$, $TiCl_2^{++}$, and $TiCl_1^{+++}$, along with the corresponding $Cl^-$ ions that are freed from the above reactive species. In addition, the RF power forms species of $H_2$, including $H^+$ ions, charge neutral $H^*$ radicals, and free electrons $e^-$. Ultimately, the $H^+$ions will react with the $TiCl_4$ or one of its reactive species to form Ti, which associates with the substrate, and HCl, which is drawn away through the gas exhaust device 16. For ease in further explanation, $TiCl_4$ and its reactive species will be generally referred to as $TiCl_x$. It can be appreciated that, the greater the charge of the $TiCl_x$, the less energy it takes to react with an $H^+$ ion. It follows that a greater number of charged $TiCl_x$ species results in a greater number of reactions with $H^+$ ions and therefore more Ti available for the substrate surface.

It is believed that the argon is a factor in determining the number and charge of $TiCl_x$ species. When subjected to the RF power, the argon making up the reaction-promoter gas divides into $Ar^+$and free electrons $e^-$. The $Ar^+$ interacts with the $TiCl_x$. While no chemical combination occurs from that reaction, a collision or other association between $Ar^+$ and the $TiCl_x$ transfers energy from the $Ar^+$ to the $TiCl_x$. This energy transfer can result in some form of excitation of the $TiCl_x$, be it vibrational, rotational, or electronic excitation. Examples of electronic excitation include merely increasing the potential of a chlorine ion $Cl^-$ to be freed from the $TiCl_x$ to the actual freeing of at least one chlorine ion $Cl^-$. As a result, $TiCl_4$ can become $TiCl_3^+$ after associating with $Ar^+$. Similarly, action between $TiCl_3^+$ and $Ar^+$ can produce $TiCl_2^{++}$, or perhaps even $TiCl^{+++}$, and so on.

Thus, the presence of argon promotes the formation of charged species from $TiCl_4$ and promotes even stronger reactivity in already charged species such as $TiCl_3^+$ and $TiCl_2^{++}$. In doing so, the argon promotes a reaction between any of these species and hydrogen and, ultimately, promotes the deposition of titanium.

Regardless as to precisely why the inclusion of argon works, experimental data indicates that it does indeed promote deposition in terms of layer uniformity and deposition rate. Uniformity is indicated by a percentage of the maximum thickness of a layer on a substrate over the minimum thickness. A high percentage represents a great lack of uniformity. PECVD processes that did not include argon in the manner described above had a uniformity ranging from 80% to 100%. An exemplary embodiment of the current invention, however, resulted in a uniformity of 5%. Similarly, PECVD without argon or other reaction-promoter resulted in almost 0 angstroms per second deposited, whereas the exemplary embodiment yielded a deposition rate ranging from about 4 to about 10 angstroms per second.

Concerning the non-obviousness of the embodiment described above, it is significant that the deposition rate of a material in this type of system 10 depends in part upon the percentage or relative fraction of reactive species available. The total pressure of a mixture of ideal gases is equal to the sum of the partial pressures of the component gases. It would therefore appear to one skilled in the art that decreasing the partial pressure of the precursor gas in the mixture would decrease the reactivity and reaction rate for the gas species in the mixture. This would seem true especially if a noble gas is contributing to the total pressure, because, by definition, noble gasses have a lack of chemical reactivity. Being at the end of a period on the periodic table, they have closed-shell configuration and associated high ionization energies. Thus, not only would the precursor be contributing less to the total pressure, but the new gas contributing to the total pressure would not have a direct part in the desired chemical reaction.

This decrease in activity actually does occur in instances detailed in the prior art wherein a noble gas is introduced into a CVD system. Specifically, noble gasses have been used in CVD processes as a diluent, wherein they dilute the reactive species to prevent over-reaction, over-etching, uneven film deposition, etc. Thus, they act as a reaction-inhibitor in those circumstances.

Noble gases have also been used in CVD processes as a carrier gas, wherein they are used only to pump a liquid into the reaction chamber.

Given the limited and often contrary uses of inert gases in CVD processes, it was surprising to discover that a dramatic increase in reaction rate as observed by film thickness and coverage (uniformity) occurred when a chemically inert gas was added to the reaction chamber. One embodiment of the invention is based, at least in part, on the realization of the unexpected result and new use of the chemically inert gases as producers of reactive species. It would not be expected that using an inert gas, which is characterized by its non-reactivity would result in increased reactivity even though partial pressure of the reactants in the plasma was actually decreased when displaced by the inclusion of argon gas.

In addition to argon, reaction-promoter gas 32 may include other noble gasses such as helium, neon, krypton, xenon, radon or combinations of those gases. Argon is preferred in terms of its availability and cost. However, the heavier noble gasses are preferred to the extent that their heaviness gives them a greater effect in collisions with the precursor constituents.

Further, the noble gasses are preferred reaction-promoter gases because they will most likely not take part in the chemical reaction at-issue, and will therefore not appear in the deposited film. However, complete inertness is not required for a reaction-promoter gas. Other embodiments of the current invention include those wherein the reaction-promoter gas is inert with respect to the reaction it promotes, although it may chemically react in other circumstances. Still other embodiments include those in which the constituent may be chemically reactive with respect to the relevant chemical reaction. For instance, using $N_2$ as the reaction-promoter gas in the example above will result in a TiN layer. Nevertheless, it may be desirable in certain circumstances to include such a material, and embodiments of the current invention encompass such circumstances within its scope. Moreover, the current invention includes embodiments wherein combinations of reaction-promoter gasses are used.

Given the matters disclosed above, one skilled in the art can appreciate that other process parameters may be established to achieve the same or similar effect. For instance, the temperatures and flow rates of the gases can be controlled to achieve the desired reaction and film quality. As one example, newer systems establish flow rates in terms of milligrams per minute rather than sccm. Thus, a $TiCl_4$ flow rate of 200 to 500 mg/minute may be preferable to provide a Ti layer. In addition, Both the power and frequency can be varied over broad ranges. Moreover, a precursor deposition gas for titanium may be selected from any suitable titanium source, including for example, tetrakis (diethylamino) titanium and tetrakis (dimethylamino) titanium. Method embodiments of the invention are equally suitable for the deposition of other metal and conductive films, and suitable precursors for the deposition reaction can be formed from an organic or inorganic metal source as dictated by the characteristics desired in the deposited film. Further, the gas sources can be provided in any form that produces the desirable reactive species relative to the metal or other desired material that needs to be deposited. Typical examples of such deposited materials include aluminum, copper, aluminum-copper alloys, tin, titanium, lead, titanium nitrides, titanium-tungsten alloys, tungsten and tungsten-lead alloys. The deposition source gases can be provided in either a gas phase or as a liquid source converted to the gas phase through a bubbler system.

Concerning the plasma, the parameters used in carrying out some embodiments will result in an inductively coupled, high density plasma (IC HDP) containing approximately 50 to 90% of a metal-containing gas. Process pressures for such an IC HDP reactor 10 may be in the range of 1 mTorr to 10 Torr and with combined gas flow rates in the range of 100 to 800 sccm. In addition, some embodiments result in a high density plasma—containing approximately $10_{11}$ to $10^{13}$ ions/cm$^3$.

Figure 7:
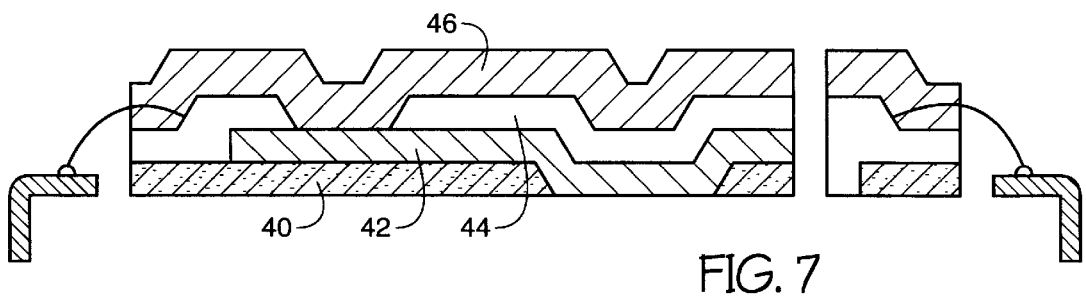
FIG. 7 is a schematic cross-section of a semiconductor die having a metal layer on it such as would be deposited in accordance with the process of this invention.

The process described herein may be used to produce a metal layer on devices such as shown in FIG. 7. FIG. 7 includes a substrate structure 40, a first metal layer 42, a dielectric 44, and a second metal layer 46. However, introducing a reaction-promoter has uses in other processes, such as reactive sputtering or plasma etching. In reactive sputtering, a reactive gas is introduced into the sputtering chamber during the sputtering process, and the material sputtered from the target combines with that gas. One result of such a combination is the formation of compound films on the substrate. One skilled in the art can now appreciate that adding a reaction promoter can promote the reactivity of the gas, thereby allowing for a greater chance at combination with the sputtered material. As for plasma etching, that process involves generating charged species in a plasma, wherein the species will be adsorbed onto the substrate, chemically react with a material on the substrate, and result in a product that may be easily removed from the substrate. Once again, including a reaction-promoter can assist in forming the reactive species. In turn, this will support the combination of the reactive species with the material. In general, the current invention has application in any process that benefits from the inclusion of a reactive species, such as plasma processes. Accordingly, the current invention includes the use of a reaction promoter in such circumstances.

One skilled in the art can appreciate that, although specific embodiments of this invention have been described above for purposes of illustration, various modifications may be made without departing from the spirit and scope of the invention. For example, the above embodiments have been discussed in terms of using a reaction-promoter material, so called because of its ability to promote a reaction. In certain exemplary embodiments, the material specifically promotes a chemical reaction between the constituent in a precursor gas with a constituent in a reactant gas. In some embodiments, such promotion takes the form of increasing the likelihood of the formation of a charged species through an energy transfer from the material to the precursor constituent. Such energy transfer may take the form of electronic excitation, vibrational excitation, rotational excitation, or combinations thereof. Such embodiments are considered to incorporate an excitation or energy-transfer material. In many embodiments, promoting such a reaction is the result of having actually created a reactive or charged species of the precursor constituent, such as creating $TiCl_3^+$ from $TiCl_4$. To that extent, the embodiments could be considered to incorporate the use of a charged-species promoter or reactivity promoter. These labels would also apply in so far as the material creates charged species from already charged species, such as creating $TiCl_2^{++}$ from $TiCl_3^+$.

Moreover, in forming charged species, the material could be described as promoting the formation of ions (such as $Cl^-$, and, again, $TiCl_3^+$). As a result, methods concerning the use of an ionization agent or ion promoter are included within the scope of the current invention. Additionally, to the extent that the reaction-promoter functions by colliding with the constituents of a gas, the current invention includes methods involving the use of a collider or colliding agent.

Further, one skilled in the art can now appreciate that promoting a chemical reaction can result in the deposition of a material, such as a Ti layer. By doing so, the current invention necessarily includes within its scope methods of using a deposition promoter. In addition, as described above, promoting a chemical reaction can alternatively result in the etching of a material or the sputtering of a material. Thus, the invention also includes methods using an etch promoter or a sputter promoter. On an even broader scale, embodiments of the current invention address promoting, encouraging, fostering, assisting, aiding, advancing, cultivating, supporting, or otherwise participating in a chemical reaction for any plasma process.

Some embodiments take place in systems that are configured to operate in at least two modes: a first mode without the use of a reaction promoter, and a second mode using a reaction promoter. Thus, several embodiments of the current invention could be described in terms eliciting a comparison to the first-mode process. Thus, the current invention includes embodiments using a reaction promoter to enhance, increase, improve, augment, amplify, help, boost, develop, or similarly affect at least one factor in the process, such as the deposition rate, the etch rate, sputter rate, ionization, the rate of reaction between a precursor and a reactant, uniformity of deposition, the density of the film deposited, integrity of the layers, production throughputs of the semiconductor devices, and the efficiency of deposition. The use of a reaction promoter can also involve shortening the process time. Accordingly, the invention is not limited except as stated in the claims.

We claim:

1. A process for PECVD deposition of a material on a substrate in a chemical vapor deposition (CVD) reaction chamber comprising:

locating said substrate in said reaction chamber;

placing said reaction chamber under vacuum pressure;

combining a precursor deposition gas containing said material and a chemically inert reactive species producer gas;

introducing said precursor deposition gas and said chemically inert reactive species producer gas into said reaction chamber; and generating a plasma from said precursor deposition gas and said chemically inert reactive species producer gas in said reaction chamber.

2. A process for PECVD deposition of a metal film on a substrate in a chamber, comprising:

placing said chamber under vacuum pressure;

introducing a metal precursor deposition gas and a chemically inert ion producer gas into said chamber, wherein said chemically inert ion producer gas is selected from a group consisting of nitrogen gas, argon gas, neon gas, krypton gas, xenon gas, helium gas and radon gas;

generating a plasma in said chamber; and depositing a layer of metal on said substrate surface.

3. The process of claim 2 wherein said step of introducing a metal precursor deposition gas and a chemically inert ion producer gas into said chamber comprises:

introducing said metal precursor deposition gas into said chamber in a range of approximately 10 to 50 sccm; and introducing said chemically inert ion producer into said chamber at a rate of at least 4,000 sccm.

4. The process of claim 2 wherein said step of generating a plasma comprises generating a high density plasma.

5. A process for PECVD deposition of a metal film on a substrate in a chemical vapor deposition (CVD) reaction chamber comprising:

placing said reaction chamber under vacuum pressure;

bubbling a chemically inert reactive species producer gas through a metal precursor deposition liquid;

introducing said gas into said reaction chamber after said bubbling step;

generating a plasma in said reaction chamber; and depositing a layer of metal on said substrate.

6. A method of forming a metal layer on a semiconductor wafer by plasma enhanced chemical vapor deposition, the method comprising the steps of:

forming a plasma, wherein said plasma contains at least a metal precursor deposition gas and a chemically inert collider gas; and exposing said wafer to said plasma.

7. The method of claim 6 further comprising a step of forming said plasma and exposing said wafer to said plasma.

8. The method of claim 6 further comprising a step of forming said metal precursor deposition gas contained in said plasma by bubbling said chemically inert collider gas through a metal precursor deposition liquid.

9. A process for PECVD deposition of a metal-containing film on a semiconductor wafer comprising the steps of:

heating said wafer in a PECVD process chamber to a temperature;

maintaining said temperature during said deposition of said metal-containing film;

maintaining a pressure in said process chamber during said deposition of said metal-containing film;

maintaining said wafer in an atmosphere of a gaseous mixture of ionized reactants formed from a metal-containing compound gas and a chemically inert reaction rate promoter gas; and initiating and maintaining plasma enhanced chemical vapor deposition from said gaseous mixture.

10. The process of claim 9 further comprising a step of bubbling said chemically inert reaction rate promoter gas through a metal-containing compound precursor liquid.

11. The process of claim 9 wherein maintaining said temperature during said deposition of said metal-containing film comprises maintaining said temperature in a temperature range between approximately 150 to 500 degrees Celsius.

12. A chemical vapor deposition method of providing a confoimal titanium-containing layer of on a semiconductor wafer within a PECVD reactor, the method comprising the following steps:

injecting gaseous $TiCl_4$ and a chemically inert reactive species producer gas within said reactor; and maintaining said reactor at a pressure and a temperature which allow for interacting said $TiCl_4$ and said chemically inert reactive species producer gas to deposit a titanium containing film on said wafer.

13. A method for PECVD deposition of metal films comprising:

providing a metal-containing precursor gas configured to form an ionized reactant species in cooperation with a chemically inert reactive species producer gas;

adding said metal-containing precursor gas to said chemically inert reactive species producer gas;

forming a plasma containing said metal-containing precursor gas and said chemically inert reactive species producer gas;

exposing a substrate in a PECVD chamber to said ionized reactant species.

14. The method of claim 13 wherein said step of providing a metal-containing precursor gas comprises providing a gas wherein a metal in said gas is selected from a group consisting of aluminum, copper, aluminum-copper alloys, tin, titanium, lead, titanium nitrides, titanium-tungsten alloys, tungsten, and tungsten-lead alloys.

15. A process for PECVD deposition of a titanium film on a surface, comprising the steps of:

housing said surface within a chamber;

establishing a temperature within said chamber;

establishing a pressure of approximately 5 Torr in said process chamber;

introducing a $TiCl_4$ gas into said chamber with a flow rate of approximately 30 sccm;

introducing an argon gas into said chamber, generally simultaneously with said step of introducing a $TiCl_4$ gas, at a flow rate of approximately 5,000 sccm;

introducing a hydrogen gas into said chamber, generally simultaneously with said step of introducing an argon gas, at a flow rate of approximately 10,000 sccm;

producing a generally uniform titanium coating on said surface.

16. The process of claim 15 wherein said producing step comprises establishing plasma enhanced chemical vapor deposition from said $TiCl_4$ gas and said hydrogen gas.

17. The process of claim 16 wherein said producing step further comprises applying a plasma-creating energy sufficiently proximate to said surface for deposition of said titanium coating.

18. A process for PECVD deposition, comprising:

placing a chamber under vacuum pressure;

combining a precursor deposition gas and a chemically inert reactive species producer gas; and generating a plasma from said gases in order to deposit a layer of metal on a substrate.

* * * * *